United States Patent
Choi

(10) Patent No.: US 9,449,916 B2
(45) Date of Patent: Sep. 20, 2016

(54) RADIO-FREQUENCY INTEGRATED CIRCUITS INCLUDING INDUCTORS AND METHODS OF FABRICATING THE SAME

(71) Applicant: SK hynix Inc., Gyeonggi-do (KR)

(72) Inventor: Jung Hun Choi, Busan (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/691,277

(22) Filed: Apr. 20, 2015

(65) Prior Publication Data
US 2016/0141245 A1 May 19, 2016

(30) Foreign Application Priority Data
Nov. 17, 2014 (KR) .......................... 10-2014-0160278

(51) Int. Cl.
| | | |
|---|---|---|
| *H01L 23/52* | (2006.01) | |
| *H01L 23/522* | (2006.01) | |
| *H01L 27/092* | (2006.01) | |
| *H01L 23/66* | (2006.01) | |
| *H01L 29/10* | (2006.01) | |
| *H01L 49/02* | (2006.01) | |
| *H01L 23/64* | (2006.01) | |

(52) U.S. Cl.
CPC ....... *H01L 23/5227* (2013.01); *H01L 23/5226* (2013.01); *H01L 23/66* (2013.01); *H01L 27/092* (2013.01); *H01L 28/10* (2013.01); *H01L 29/1095* (2013.01); *H01L 23/645* (2013.01); *H01L 2223/6672* (2013.01)

(58) Field of Classification Search
CPC ..... H01L 29/76; H01L 29/94; H01L 31/062; H01L 31/119; H01L 23/5227; H01L 23/645; H01L 29/1095
USPC .................................................. 257/315, 531
See application file for complete search history.

(56) References Cited

U.S. PATENT DOCUMENTS

| | | | | |
|---|---|---|---|---|
| 4,973,922 A | * | 11/1990 | Embree | ................... H03B 7/06 257/312 |
| 6,608,362 B1 | * | 8/2003 | Kai | ..................... H01L 27/0629 257/453 |
| 6,949,440 B2 | * | 9/2005 | Gau | ..................... H01L 27/0629 257/E21.364 |
| 7,376,212 B2 | * | 5/2008 | Dupuis | .................. H01L 23/48 257/E23.01 |
| 2001/0023111 A1 | * | 9/2001 | Yuan | ...................... H01L 23/66 438/409 |
| 2002/0179977 A1 | | 12/2002 | Wong et al. | |
| 2004/0041234 A1 | * | 3/2004 | Sia | ......................... H01L 27/08 257/531 |
| 2005/0068146 A1 | * | 3/2005 | Jessie | .................. H01F 17/0006 336/200 |
| 2009/0152675 A1 | * | 6/2009 | Kim | ...................... H01L 27/08 257/531 |
| 2009/0160018 A1 | * | 6/2009 | Nabeshima | ........ H01L 23/5227 257/531 |
| 2011/0042782 A1 | * | 2/2011 | Chao | ...................... H01L 28/10 257/531 |
| 2012/0313210 A1 | * | 12/2012 | Miyatake | .............. H01L 31/105 257/443 |
| 2013/0168809 A1 | * | 7/2013 | Yen | ..................... H01L 23/5227 257/531 |
| 2013/0328164 A1 | * | 12/2013 | Cheng | .................... H01L 28/10 257/531 |
| 2014/0002187 A1 | * | 1/2014 | McPartlin | .......... H01L 29/7378 330/250 |
| 2014/0217426 A1 | * | 8/2014 | Inokuchi | .......... H01L 29/41725 257/88 |
| 2015/0287774 A1 | * | 10/2015 | Burton | .................... H01L 28/60 257/532 |

* cited by examiner

*Primary Examiner* — Nathan W Ha
(74) *Attorney, Agent, or Firm* — IP & T Group LLP

(57) ABSTRACT

A radio-frequency integrated circuit (RFIC) includes a substrate, an N-type deep well region disposed in an upper region of the substrate and having a top surface coplanar with a top surface of the substrate, an inductor disposed over the N-type deep well region; and an insulation layer disposed between the inductor and the N-type deep well region, wherein the inductor is electrically insulated from the N-type deep well region by the insulation layer.

16 Claims, 12 Drawing Sheets

RADIO-FREQUENCY INTEGRATED CIRCUITS INCLUDING INDUCTORS AND METHODS OF FABRICATING THE SAME

CROSS-REFERENCE TO RELATED APPLICATION

The present application claims priority under 35 U.S.C 119(a) to Korean Patent Application No. 10-2014-0160278, filed on Nov. 17, 2014, in the Korean Intellectual Property Office, which is herein incorporated by reference in its entirety.

BACKGROUND

1. Technical Field

Various embodiments of the present disclosure relate to radio-frequency integrated circuits, and more particularly, to radio-frequency integrated circuits including inductors and methods of fabricating the same.

2. Related Art

Radio-frequency integrated circuits (RFICs) realized using complementary metal-oxide-semiconductor (CMOS) process technologies are increasingly in demand with the development of mobile communication systems. Performance of the RFICs has been continuously improved as CMOS process technologies are developed to provide high performance MOS transistors. However, there may be some limitations in improving all of functions of the RFICs with only the high performance MOS transistors. This is due to each of the RFICs being configured to include passive elements, such as on-chip inductors employed in analog circuits.

Characteristics of the on-chip inductors formed on a silicon substrate may be influenced by parasitic elements of a silicon substrate. Accordingly, there may be a limitation in improving the characteristics of the on-chip inductors using only process technologies. Recently, various manners have been proposed to improve the characteristics of the on-chip inductors. One of the various manners for improving the characteristics of the on-chip inductors is to increase resistivity of the silicon substrate. However, if the resistivity of the silicon substrate increases, it may be difficult to optimize impurity concentration profiles of well regions and source/drain regions as well as structural profiles of isolation layers in CMOS process technologies.

SUMMARY

Various embodiments are directed to RFICs including inductors and methods of fabricating the same.

According to an embodiment, an RFIC includes a substrate, an N-type deep well region disposed in an upper region of the substrate and having a top surface coplanar with a top surface of the substrate, an inductor disposed over the N-type deep well region; and an insulation layer disposed between the inductor and the N-type deep well region, wherein the inductor is electrically insulated from the N-type deep well region by the insulation layer.

According to another embodiment, an RFIC includes a substrate having a first region and a second region, a first N-type deep well region and a second N-type deep well region respectively disposed in the first region and the second region of the substrate, an active element disposed in the first N-type deep well region, and an inductor disposed over the second N-type deep well region, wherein the inductor is electrically insulated from the second N-type deep well region by an insulation layer disposed between the inductor and the second N-type deep well region.

According to another embodiment, a method of fabricating an RFIC includes forming a first N-type deep well region and a second N-type deep well region in a first region and a second region of a substrate, respectively, forming a P-type well region in the first N-type deep well region, forming an N-type well region in the P-type well region, forming an NMOS transistor in the P-type well region, forming a PMOS transistor in the N-type well region, forming an inductor over the second N-type deep well region, and forming an insulation layer between the inductor and the second N-type deep well region, wherein the inductor is electrically insulated from the second N-type deep well region by the insulation layer.

According to another embodiment, a method of fabricating an RFIC includes forming a first N-type deep well region and a second N-type deep well region in a first region and a second region of a substrate, respectively, forming an N-type well region in the first N-type deep well region, forming a P-type well region in the N-type well region, wherein a bottom surface of the P-type well region is in direct contact with the first N-type deep well region, forming an NMOS transistor in the P-type well region, forming an inductor over the second N-type deep well region, and forming an insulation layer between the inductor and the second N-type deep well region, wherein the inductor is electrically insulated from the second N-type deep well region by the insulation layer.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on", "over", "above", "under", "beneath" or "below" another element, it may directly contact the other element, or at least one intervening element may be present therebetween.

Accordingly, the terms such as "on", "over", "above", "under", "beneath", "below" and the like that are used herein are for the purpose of describing particular embodiments only and are not intended to limit the scope of the present disclosure.

It will be further understood that when an element is referred to as being "connected" or "coupled" to another element, it can be directly connected or coupled to the other element or intervening elements may be present.

Figure 1:
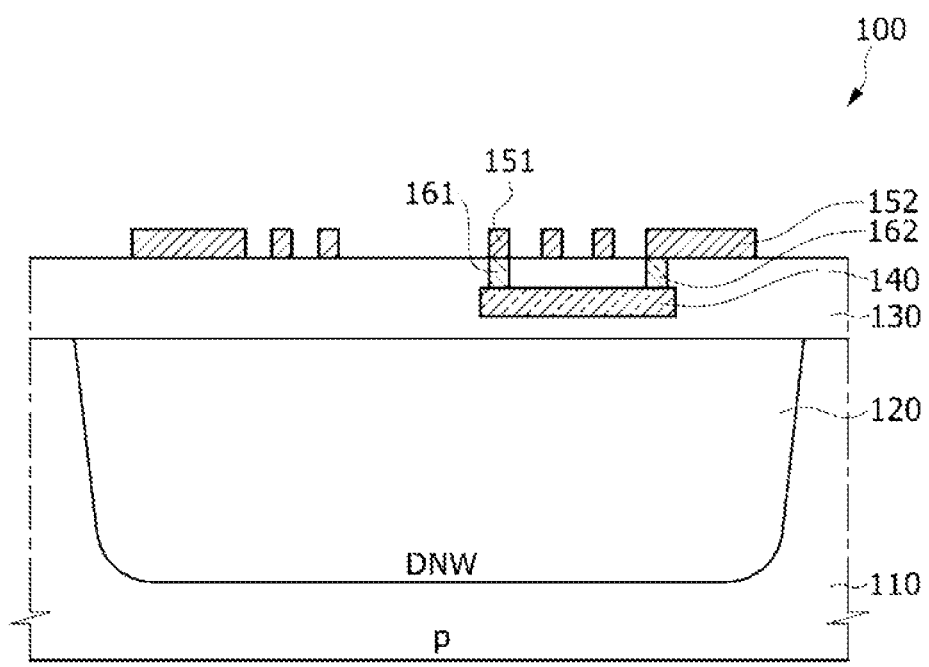
FIG. 1 is a cross-sectional view illustrating an RFIC according to an embodiment.
Figure 2:
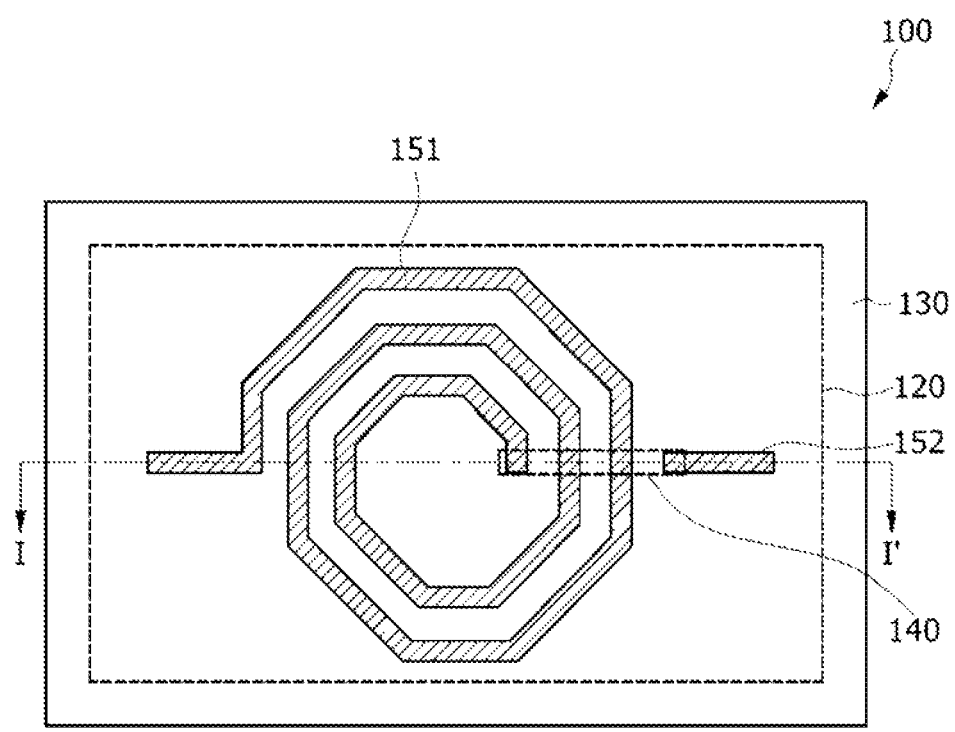
FIG. 2 is a plan view of the RFIC shown in FIG. 1.

FIG. 1 is a cross-sectional view illustrating an RFIC 100 according to an embodiment, and FIG. 2 is a plan view of the RFIC 100 shown in FIG. 1. FIG. 1 corresponds to a cross-sectional view taken along a line I-I' of FIG. 2. Referring to FIGS. 1 and 2, the RFIC 100 may include inductor's components 140, 151 and 152 disposed on a substrate 110. The substrate 110 may be a P-type silicon substrate. Although not shown in FIGS. 1 and 2, passive elements such as resistors or capacitors employed in analog circuits and/or active elements such as MOS transistors employed in CMOS circuits may be disposed on other regions of the substrate 110.

An N-type deep well region (DNW) 120 may be disposed in an upper region of the substrate 110. That is, the substrate 110 may surround sidewalls and a bottom surface of the N-type deep well region (DNW) 120, and only a top surface of the N-type deep well region (DNW) 120 may be exposed at a top surface of the substrate 110. The N-type deep well region (DNW) 120 may be a well region which is different from well regions acting as channel body regions of MOS transistors. The N-type deep well region (DNW) 120 may be deeper than the other well regions to reduce undesired interference and noises in the RFIC 100. No impurity diffusion regions are disposed in the N-type deep well region (DNW) 120. The top surface of the N-type deep well region (DNW) 120 may be coplanar with, that is, flush with, the top surface of the substrate 110. In some embodiments, an ion implantation process for forming the N-type deep well region (DNW) 120 may be performed at a certain energy level so that, for example, a projection range ($R_P$) of about 1.2 micrometers to about 1.7 micrometers is set in the substrate 110. In such a case, even though a junction depth of the N-type deep well region (DNW) 120 varies due to a subsequent drive-in process that is, a subsequent diffusion process, the N-type deep well region (DNW) 120 may typically maintain a junction depth of at least about 1.5 micrometers to about 2 micrometers when measured after the subsequent drive-in process. In some embodiments, the N-type deep well region (DNW) 120 may be formed by implanting impurities into the substrate 110 to a dose of about $1 \times 10^{13}$ atoms/cm$^2$.

An insulation layer 130 may be disposed on the N-type deep well region (DNW) 120 and the substrate 110. In some embodiments, the insulation layer 130 may include a silicon oxide layer. A lower conductive layer 140 serving as one of the components of the inductor may be disposed in the insulation layer 130. The lower conductive layer 140 may be buried in the insulation layer 130.

A first upper conductive layer 151 and a second upper conductive layer 152 serving as components of the inductor may be disposed on the insulation layer 130. The lower conductive layer 140, the first upper conductive layer 151, and the second upper conductive layer 152 may constitute the inductor. The first upper conductive layer 151 may be electrically connected to one end of the lower conductive layer 140 through a first via 161 disposed in the insulation layer 130. The second upper conductive layer 152 may be electrically connected to the other end of the lower conductive layer 140 through a second via 162 disposed in the insulation layer 130. Thus, the first and second upper conductive layers 151 and 152 may be electrically connected to each other through the first via 161, the lower conductive layer 140, and the second via 162.

As illustrated in FIG. 2, when viewed from the top the first upper conductive layer 151 connected to the first via 161 may have a spiral shape. The first upper conductive layer 151 may have an octagonal standard inductor structure when viewed from the top. Alternatively, the first upper conductive layer 151 may have a circular stripe loop shape, a rectangular stripe loop shape, or a hexagonal stripe loop shape.

In some embodiments, the first upper conductive layer 151 may include a patterned ground shield (PGS) scheme that suppresses the eddy current which is generated in general silicon substrates having a low resistivity of about 1 Ω·cm to about 3 Ω·cm. In some other embodiments, the first upper conductive layer 151 may be configured to have a stacked inductor structure to obtain a maximum inductance value in a limited area or may be configured to have a multi-layered inductor structure that includes two or more metal layers which are disposed in parallel to increase an effective thickness thereof.

As illustrated in FIGS. 1 and 2, the lower conductive layer 140 in the insulation layer 130 may electrically connect the first upper conductive layer 151 to the second upper conductive layer 152. The area that the inductor, which includes the lower conductive layer 140 and the first and second upper conductive layers 151 and 152, occupies may be less than the area of the N-type deep well region (DNW) 120. That is, when viewed from the top the entire inductor may be disposed in the N-type deep well region (DNW) 120.

The quality (Q) factor of the inductor may be expressed by the following equation 1.

$$Q = \omega L / rs \qquad \text{(Equation 1)}$$

where, "ω" denotes an angular frequency, "L" denotes an inductance value of the inductor, and "rs" is determined by a series of resistance values and a skin effect component of conductive lines constituting the inductor and by a loss component in a silicon substrate. The loss component in the silicon substrate may relate to signal loss which is due to parasitic capacitive coupling and eddy current generation. As can be seen from the equation 1, the Q factor of the inductor may be increased by reducing the loss component in the silicon substrate. According to an embodiment, the inductor may be disposed on the N-type deep well region (DNW) 120 corresponding to a high resistive region, thereby reducing the loss component in the silicon substrate. As a result, the Q factor of the inductor may increase.

Figure 3:
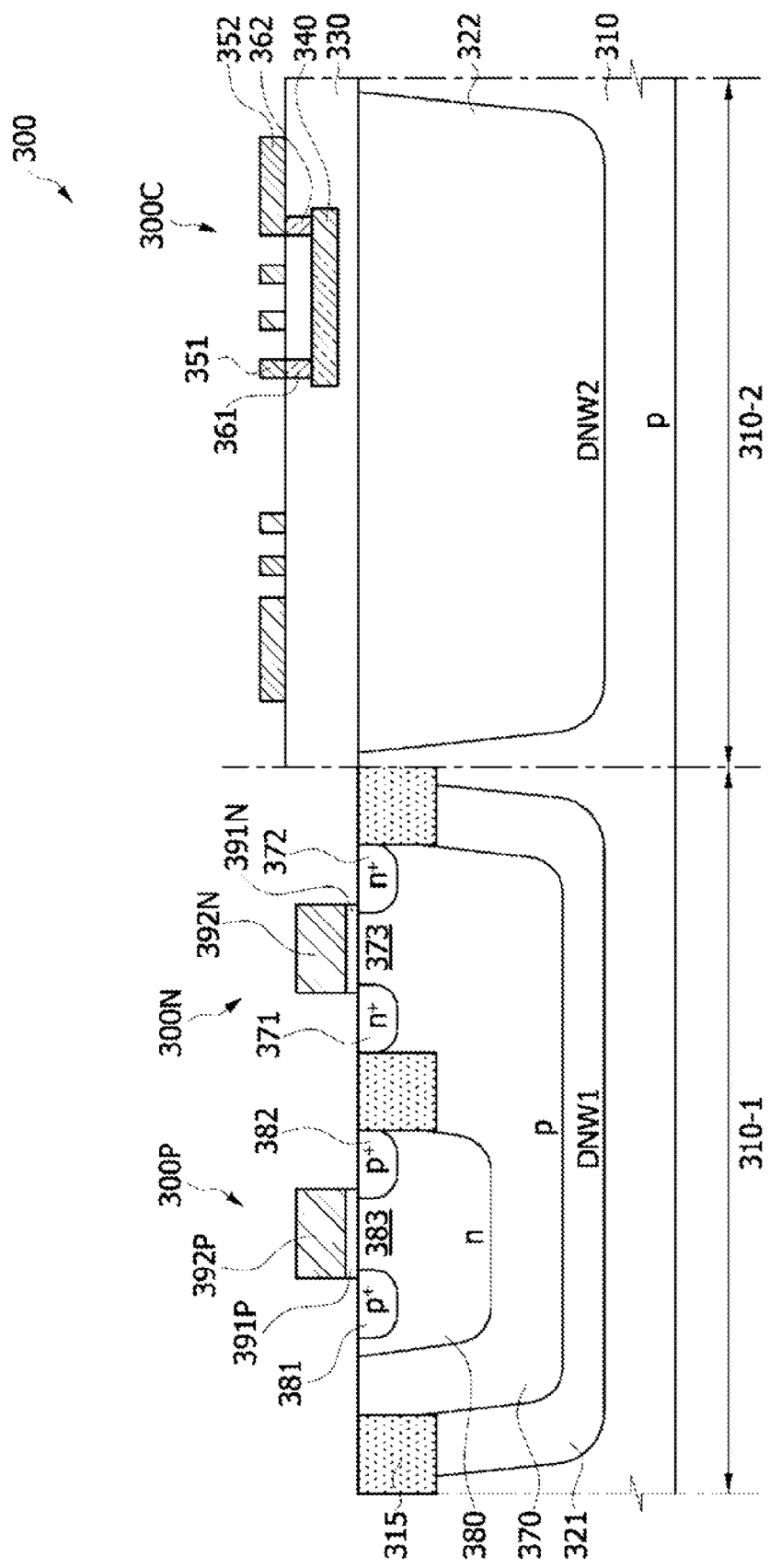
FIG. 3 is a cross-sectional view illustrating an RFIC according to another embodiment.

FIG. 3 is a cross-sectional view illustrating an RFIC 300 according to another embodiment. Referring to FIG. 3, the RFIC 300 may include a CMOS semiconductor device and an inductor 300C. The CMOS semiconductor device and the inductor 300C are disposed in and/or on a single substrate 310. The CMOS semiconductor device may include a PMOS transistor 300P and an NMOS transistor 300N. The CMOS semiconductor device may be disposed on a first region 310-1 of the substrate 310, and the inductor 300C may be disposed on a second region 310-2 of the substrate 310.

In some embodiments, the substrate 310 may be a P-type silicon substrate. A first N-type deep well region (DNW1) 321 may be disposed in an upper region of the first region 310-1 of the substrate 310. A second N-type deep well region (DNW2) 322 may be disposed in an upper region of the second region 310-2 of the substrate 310. In FIG. 3, the first and second N-type deep well regions (DNW1 and DNW2) 321 and 322 are respectively disposed in the first and second regions 310-1 and 310-2 of the substrate 310. However, embodiments are not limited thereto. For example, in some embodiments, the first and second N-type deep well regions (DNW1 and DNW2) 321 and 322 may be connected to each other to constitute a single N-type deep well region.

The first N-type deep well region (DNW1) 321 may be deeper than other well regions to suppress generation of undesired interference and noise in the RFIC 300. The second N-type deep well region (DNW2) 322 may be formed while the first N-type deep well region (DNW1) 321 is formed. That is, the first and second N-type deep well regions (DNW1 and DNW2) 321 and 322 may be formed at the same time using the same ion implantation process and the same diffusion process.

While various diffusion regions that is, various impurity regions, are disposed in the first N-type deep well region (DNW1) 321 to provide the CMOS semiconductor device, no diffusion region is disposed in the second N-type deep well region (DNW2) 322. A top surface of the second N-type deep well region (DNW2) 322 may be coplanar with a top surface of the substrate 310.

In some embodiments, an ion implantation process for forming the first and second N-type deep well regions (DNW1 and DNW2) 321 and 322 may be performed at a certain energy level, for example, appropriate to set the projection range ($R_P$) in the substrate 310 to about 1.2 micrometers to about 1.7 micrometers. In such a case, even though unction depths of the first and second N-type deep well regions (DNW1 and DNW2) 321 and 322 vary due to a subsequent drive-in process that is, a subsequent diffusion process, the first and second N-type deep well regions (DNW1 and DNW2) 321 and 322 may be typically formed to have the junction depth of at least about 1.5 micrometers to about 2 micrometers when measured after the subsequent drive-in process.

In some embodiments, the first and second N-type deep well regions (DNW1 and DNW2) 321 and 322 may be formed by implanting impurities into the substrate 310 at a dose of about $1 \times 10^{13}$ atoms/cm$^2$.

A P-type well region 370 may be disposed in an upper region of the first N-type deep well region (DNW1) 321. A portion 373 of an upper region of the P-type well region 370 may serve as a channel region of the NMOS transistor 300N. An N-type well region 380 may be disposed in a portion of an upper region of the P-type well region 370. A portion 383 of an upper region of the N-type well region 380 may serve as a channel region of the PMOS transistor 300P. An N-type source region 371 and an N-type drain region 372 may be disposed in an upper region of the P-type well region 370 and may be separated from each other by the channel region 373. A gate insulation layer 391N and a gate electrode 392N may be sequentially stacked on the channel region 373. The gate insulation layer 391N, the gate electrode 392N, the N-type source region 371, the N-type drain region 372, and the channel region 373 may constitute the NMOS transistor 300N.

A P-type source region 381 and a P-type drain region 382 may be disposed in an upper region of the N-type well region 380 and may be separated from each other by the channel region 383. A gate insulation layer 391P and a gate electrode 392P may be sequentially stacked on the channel region 383. The gate insulation layer 391P, the gate electrode 392P, the P-type source region 381, the P-type drain region 382, and the channel region 383 may constitute the PMOS transistor 300P. A trench isolation layer 315 may be disposed in the first region 310-1 of the substrate 310 to surround edges of the PMOS transistor 300P and the NMOS transistor 300N. That is, the PMOS transistor 300P and the NMOS transistor 300N may be separated and isolated from each other by the trench isolation layer 315.

Although not shown in the drawings, the first N-type deep well region (DNW1) 321 may be electrically connected to a bias line. Thus, the first N-type deep well region (DNW1) 321 may receive a positive high voltage through the bias line. The first N-type deep well region (DNW1) 321 and the P-type well region 370 may constitute a first parasitic PN diode. In addition, the first N-type deep well region (DNW1) 321 and the P-type substrate 310 may constitute a second parasitic PN diode. Thus, if a positive high voltage is applied to the first N-type deep well region (DNW1) 321, both of the first and second parasitic PN diodes are reverse-biased to isolate the substrate 310 and prevent cross-talk phenomena from occurring in the CMOS semiconductor device.

An insulation layer 330 may be disposed on top surfaces of the substrate 310 and the second N-type deep well region (DNW2) 322 in the second region 310-2. In some embodiments, the insulation layer 330 may include a silicon oxide layer. A lower conductive layer 340 serving as one of the components of the inductor 300C may be disposed in the insulation layer 330. The lower conductive layer 340 may be buried in the insulation layer 330. A first upper conductive layer 351 and a second upper conductive layer 352 serving as components of the inductor 300C may be disposed on the insulation layer 330. The first upper conductive layer 351 may be electrically connected to one end of the lower conductive layer 340 through a first via 361 disposed in the insulation layer 330. The second upper conductive layer 352 may be electrically connected to the other end of the lower conductive layer 340 through a second via 362 disposed in the insulation layer 330. Thus, the first and second upper conductive layers 351 and 352 may be electrically connected to each other through the first via 361, the lower conductive layer 340, and the second via 362.

As described with reference to FIG. 2, the first upper conductive layer 351 of the inductor 300C may be disposed to have a spiral shape when viewed from the top. In another embodiment, the first upper conductive layer 351 may have an octagonal standard inductor structure when viewed from the top. Alternatively, the first upper conductive layer 351 may have a circular stripe loop shape, a rectangular stripe loop shape, or hexagonal stripe loop shape.

In some embodiments, the first upper conductive layer 351 may include a patterned ground shield (PGS) scheme that suppresses eddy current which is generated in general silicon substrates having a low resistivity of about 1 Ω·cm to about 3 Ω·cm. In some other embodiments, the first upper conductive layer 351 may be configured to have a stacked inductor structure to obtain a maximum inductance value in a limited planar area or may be configured to have a multi-layered inductor structure that includes two or more metal layers which are disposed in parallel to increase an effective thickness thereof.

The lower conductive layer 340 in the insulation layer 330 may electrically connect the first upper conductive layer 351 to the second upper conductive layer 352. The area occupied by the inductor 300C, which includes the lower conductive layer 340 and the first and second upper conductive layers 351 and 352, may be less than the area occupied by the second N-type deep well region (DNW2) 322. That is, an entire portion of the inductor 300C may be disposed within the second N-type deep well region (DNW2) 322 when viewed from the top.

As described with reference to the equation 1, the Q factor of the inductor 300C may be increased by reducing the loss component in the substrate 310. According to the embodiment, the inductor 300C may be disposed on the second N-type deep well region (DNW2) 322 corresponding to a high resistive region, thereby reducing the loss component in the substrate 310. As a result, the Q factor of the inductor 300C may increase. FIG. 3 illustrates an example in which both of the PMOS transistor 300P and the NMOS transistor 300N are disposed on the first region 310-1 of the substrate 310. However, the present disclosure is not limited thereto. For example, in some embodiments, only the PMOS transistor 300P may be disposed on the first region 310-1 of the substrate 310 or only the NMOS transistor 300N may be disposed on the first region 310-1 of the substrate 310. If only the NMOS transistor 300N is disposed on the first region 310-1 of the substrate 310, the N-type well region 380 may be omitted from the P-type well region 370.

Figure 4:
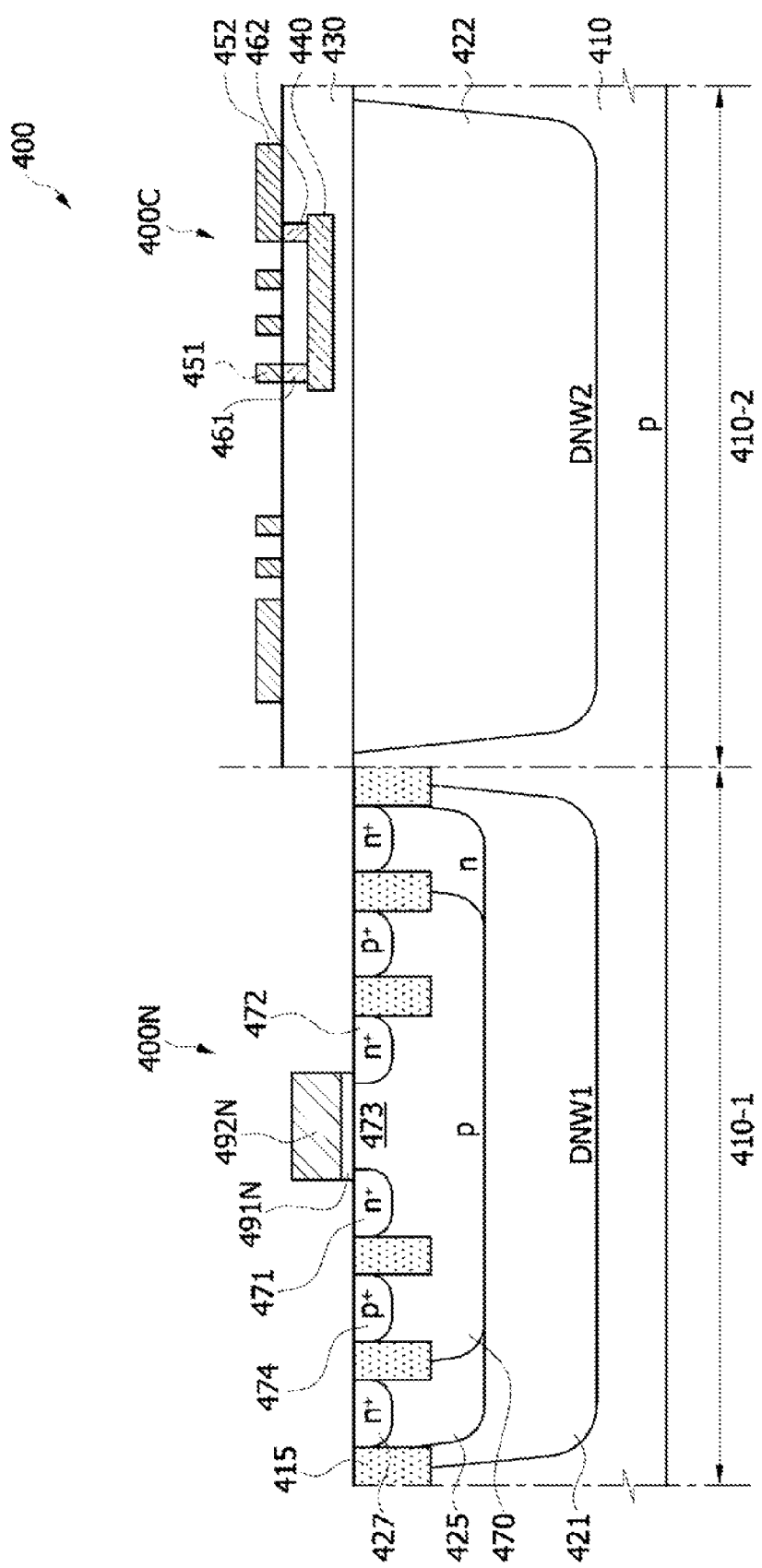
FIG. 4 is a cross-sectional view illustrating an RFIC according to yet another embodiment.

FIG. 4 is a cross-sectional view illustrating an RFIC 400 according to yet another embodiment. Referring to FIG. 4, the RFIC 400 may include an NMOS transistor 400N and an inductor 400C which are disposed in and/or on a single substrate 410. The NMOS transistor 400N may be disposed on a first region 410-1 of the substrate 410, and the inductor 400C may be disposed on a second region 410-2 of the substrate 410. In some embodiments, the substrate 410 may be a P-type silicon substrate. A first N-type deep well region (DNW1) 421 may be disposed in an upper region of the first region 410-1 of the substrate 410. A second N-type deep well region (DNW2) 422 may be disposed in an upper region of the second region 410-2 of the substrate 410. Although FIG. 4 illustrates an example in which the first and second N-type deep well regions (DNW1 and DNW2) 421 and 422 are respectively disposed in the first and second regions 410-1 and 410-2 of the substrate 410, the present disclosure is not limited thereto. For example, in some embodiments, the first and second N-type deep well regions (DNW1 and DNW2) 421 and 422 may be connected to each other to constitute a single N-type deep well region.

The first N-type deep well region (DNW1) 421 may be deeper than other well regions to suppress generation of undesired interference and noise in the RFIC 400. The second N-type deep well region (DNW2) 422 may be formed while the first N-type deep well region (DNW1) 421 is formed. That is, the first and second N-type deep well regions (DNW1 and DNW2) 421 and 422 may be formed using the same ion implantation process and the same diffusion process.

While various diffusion regions that is, various impurity regions, are disposed in the first N-type deep well region (DNW1) 421 to provide the NMOS transistor 400N, no diffusion region is disposed in the second N-type deep well region (DNW2) 422. A top surface of the second N-type deep well region (DNW2) 422 may be coplanar with a top surface of the substrate 410. In some embodiments, an ion implantation process for forming the first and second N-type deep well regions (DNW1 and DNW2) 421 and 422 may be performed using a certain level of energy sufficient to set the projection range ($R_P$) into the substrate 410 at about 1.2 micrometers to about 1.7 micrometers. In such a case, even though a junction depth of the first and second N-type deep well regions (DNW1 and DNW2) 421 and 422 varies due to a subsequent drive-in process that is, a subsequent diffusion process, the first and second N-type deep well regions (DNW1 and DNW2) 421 and 422 may be typically formed to have a junction depth of at least about 1.5 micrometers to about 2 micrometers when measured after the subsequent drive-in process. In some embodiments, the first and second N-type deep well regions (DNW1 and DNW2) 421 and 422 may be formed by implanting impurities into the substrate 410 to a dose of about $1 \times 10^{13}$ atoms/cm$^2$.

An N-type well region 425 may be disposed in an upper region of the first N-type deep well region (DNW1) 421. A P-type well region 470 may be disposed in the N-type well region 425. A bottom surface of the P-type well region 470 may contact the first N-type deep well region (DNW1) 421. Sidewalls of the P-type well region 470 may be entirely or partially surrounded by the N-type well region 425. A portion 473 of an upper region of the P-type well region 470 may serve as a channel region of the NMOS transistor 400N. An N-type source region 471 and an N-type drain region 472 may be disposed in an upper region of the P-type well region 470 and may be separated from each other by the channel region 473. A gate insulation layer 491N and a gate electrode 492N may be sequentially stacked on the channel region 473. The gate insulation layer 491N, the gate electrode 492N, the N-type source region 471, the N-type drain region 472, and the channel region 473 may constitute the NMOS transistor 400N.

An N-type well contact region 427 may be disposed in an upper region of the N-type well region 425. A bias voltage may be applied to the N-type well contact region 427 through a contact (not shown), and the bias voltage may be transmitted to the first N-type deep well region (DNW1) 421 through the N-type well region 425. P-type well contact regions 474 may be disposed in an upper region of the P-type well region 470.

The P-type well contact regions 474 may receive a bias voltage through contacts (not shown), and the bias voltage applied to the P-type well contact regions 474 may be transmitted to the P-type well region 470. A trench isolation layer 415 may be disposed in the first region 410-1 of the substrate 410 to surround edges of the NMOS transistor 400N and to define the N-type well contact region 427 and the P-type well contact regions 474.

The first N-type deep well region (DNW1) 421 and the P-type well region 470 may constitute a first parasitic PN diode. In addition, the first N-type deep well region (DNW1) 421 and the P-type substrate 410 may constitute a second parasitic PN diode. Thus, if a positive high voltage is applied to the first N-type deep well region (DNW1) 421, both of the first and second parasitic PN diodes are reverse-biased to isolate the substrate 410 from the NMOS transistor 400N and to prevent cross-talk phenomena from occurring in the NMOS transistor 400N.

An insulation layer 430 may be disposed on top surfaces of the substrate 410 and the second N-type deep well region (DNW2) 422 in the second region 410-2. In some embodiments, the insulation layer 430 may include a silicon oxide layer. A lower conductive layer 440 serving as one of the components of the inductor 400C may be disposed in the insulation layer 430. The lower conductive layer 440 may be buried in the insulation layer 430.

A first upper conductive layer 451 and a second upper conductive layer 452 acting as components of the inductor 400C may be disposed on the insulation layer 430. The first upper conductive layer 451 may be electrically connected to one end of the lower conductive layer 440 through a first via 461 disposed in the insulation layer 430.

The second upper conductive layer 452 may be electrically connected to the other end of the lower conductive layer 440 through a second via 462 disposed in the insulation layer 430. Thus, the first and second upper conductive layers 451 and 452 may be electrically connected to each other through the first via 461, the lower conductive layer 440, and the second via 462.

As described with reference to FIG. 2, the first upper conductive layer 451 of the inductor 400C may have a spiral shape. The first upper conductive layer 451 may have an octagonal standard inductor structure when viewed from the top. Alternatively, the first upper conductive layer 451 may have a circular stripe loop shape, a rectangular stripe loop shape, or hexagonal stripe loop shape.

In some embodiments, the first upper conductive layer 451 may include a patterned ground shield (PGS) scheme that suppresses eddy current which is generated in general silicon substrates having a low resistivity of about 1 Ω·cm to about 3 Ω·cm.

In some other embodiments, the first upper conductive layer 451 may be configured to have a stacked inductor structure to obtain a maximum inductance value in a given area or may be configured to have a multi-layered inductor structure that includes two or more metal layers which are disposed in parallel to increase an effective thickness thereof.

The lower conductive layer 440 in the insulation layer 430 may electrically connect the first upper conductive layer 451 to the second upper conductive layer 452. The area occupied by the inductor 400C, which includes the lower conductive layer 440 and the first and second upper conductive layers 451 and 452, may be less than the area occupied by the second N-type deep well region (DNW2) 422. That is, an entire portion of the inductor 400C may be disposed in a portion of the second N-type deep well region (DNW2) 422 in a plan view.

As described with reference to the equation 1, the Q factor of the inductor 400C may increase by reducing the loss component in the substrate 410. According to the embodiment shown in FIG. 4, the inductor 400C may be disposed on the second N-type deep well region (DNW2) 422 corresponding to a high resistive region, thereby reducing the loss component in the substrate 410. As a result, the Q factor of the inductor 400C may increase.

Although FIG. 4 illustrates an example in which only the NMOS transistor 400N is disposed on the first region 410-1 of the substrate 410, the present disclosure is not limited thereto. For example, in some embodiments, only a PMOS transistor may be disposed on the first region 410-1 of the substrate 410 or both of the NMOS transistor 400N and the PMOS transistor may be disposed on the first region 410-1 of the substrate 410.

Figure 5:
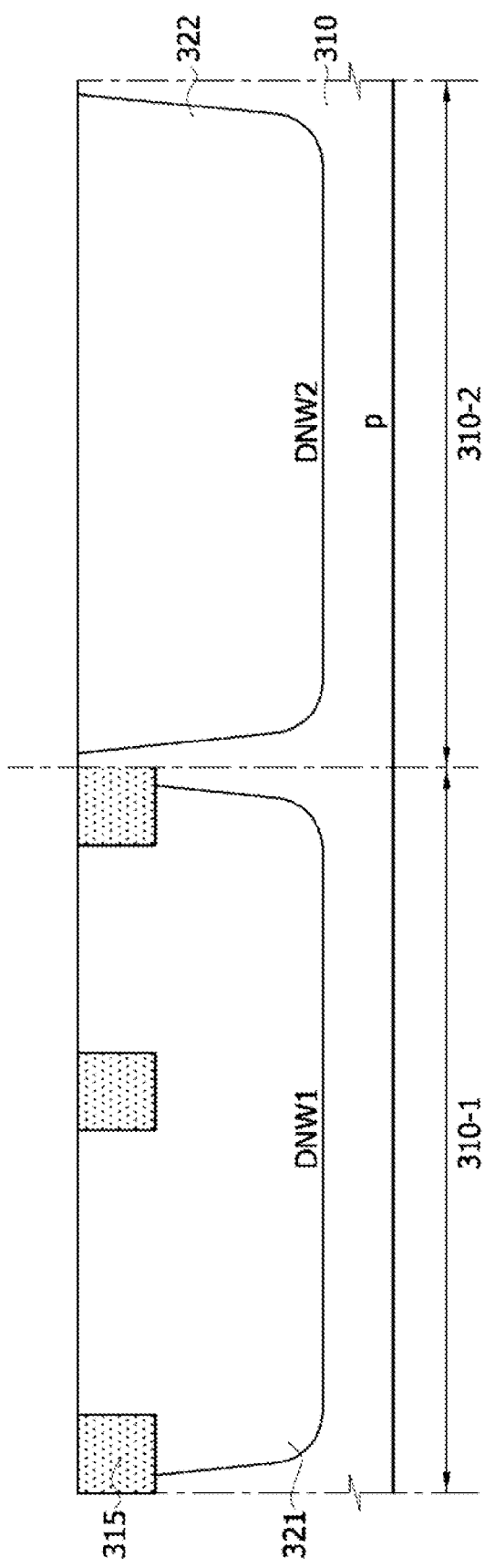
FIGS. 5, 6 and 7 are cross-sectional views illustrating a method of fabricating the RFIC shown in FIG. 3.
Figure 6:
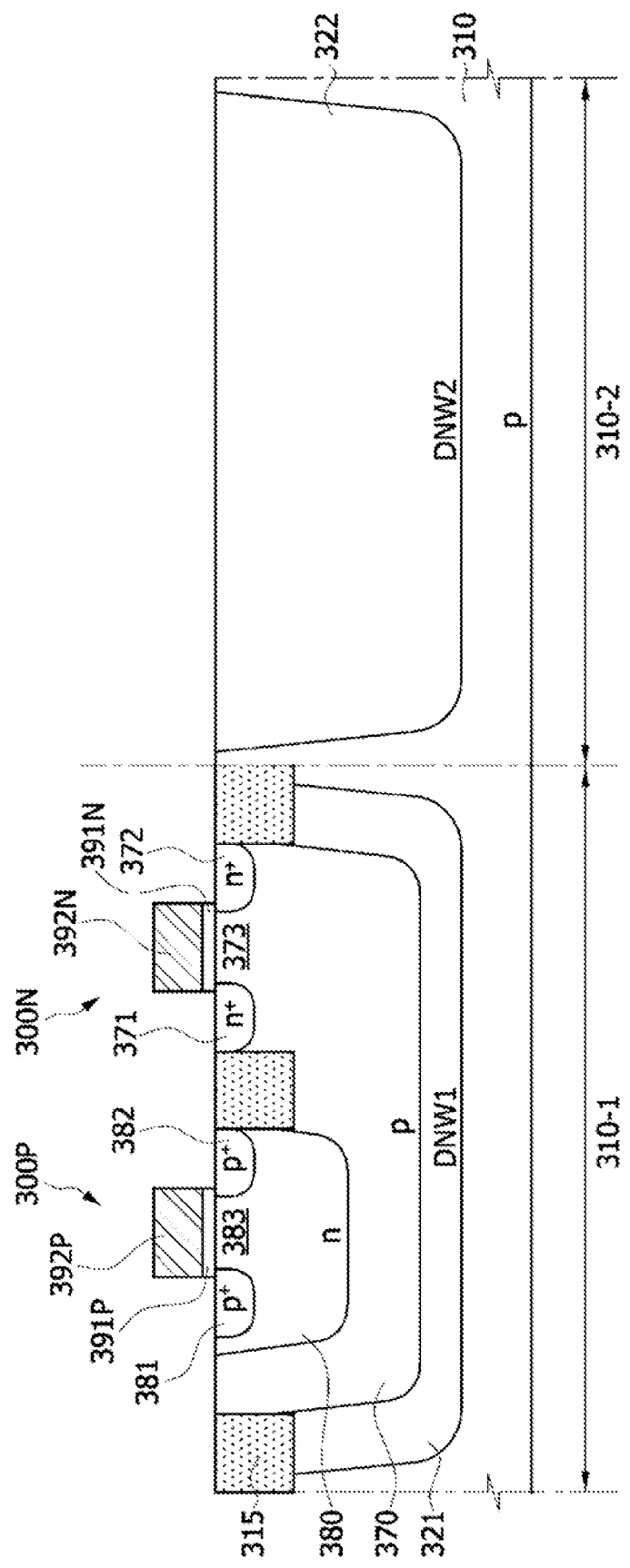
Figure 7:
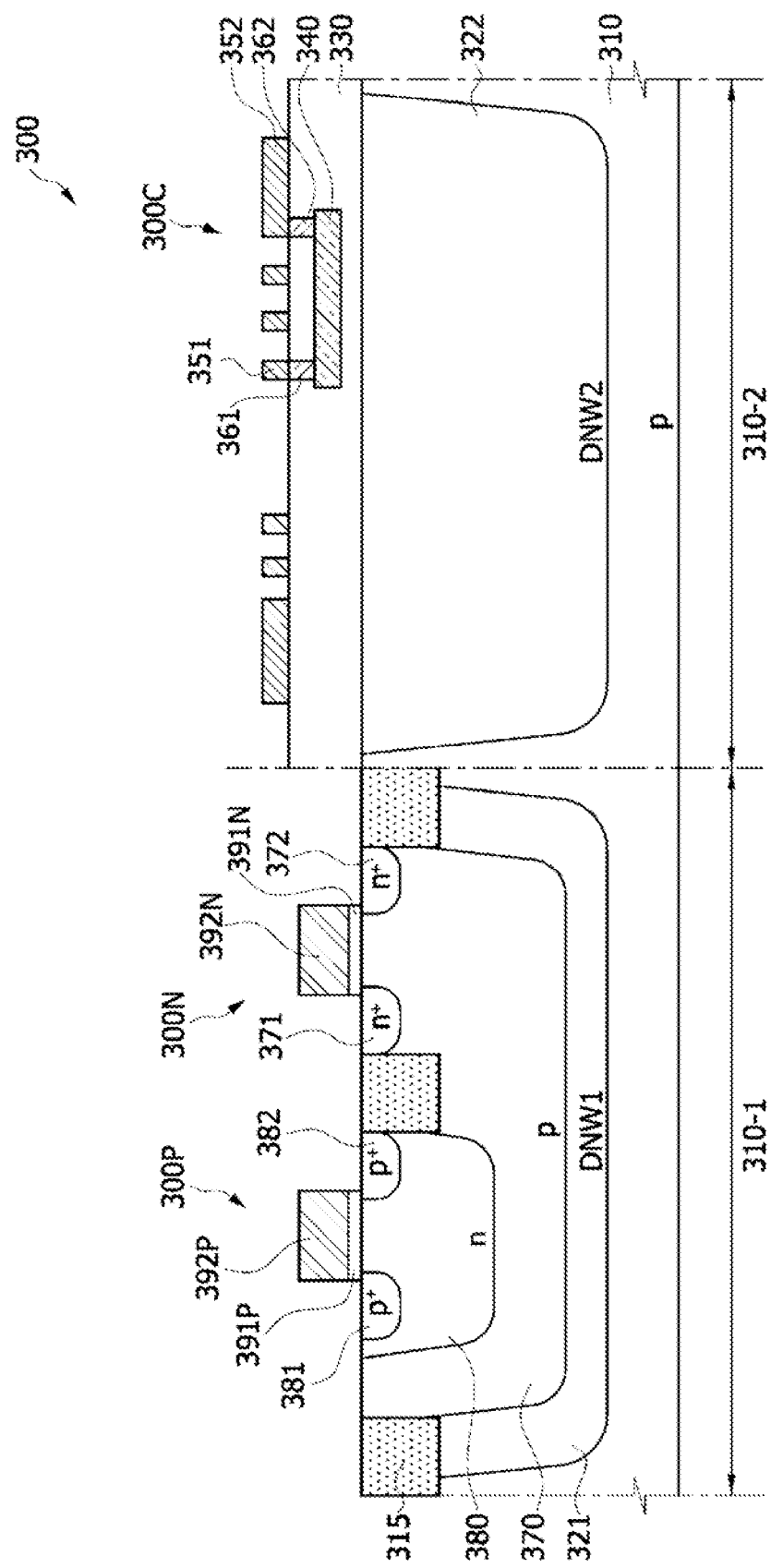

FIGS. 5, 6 and 7 are cross-sectional views illustrating a method of fabricating the RFIC 300 shown in FIG. 3. Referring to FIG. 5, a trench isolation layer 315 may be formed in a substrate 310 having a first region 310-1 and a second region 310-2. The substrate 310 may be a P-type substrate. The trench isolation layer 315 may be formed to define active regions. Subsequently, a first N-type deep well region (DNW1) 321 and a second N-type deep well region (DNW2) 322 may be formed in the first and second regions 310-1 and 310-2 of the substrate 310, respectively.

The first and second N-type deep well regions (DNW1 and DNW2) 321 and 322 may be formed using an ion implantation process and a diffusion process. Although not shown in the drawings, an ion implantation mask may be formed on the substrate 310, and the ion implantation process for forming the first and second N-type deep well regions (DNW1 and DNW2) 321 and 322 may be performed with the ion implantation mask. The first and second N-type deep well regions (DNW1 and DNW2) 321 and 322 may be simultaneously formed to have substantially the same junction depth and the same impurity concentration.

In some embodiments, the ion implantation process for forming the first and second N-type deep well regions (DNW1 and DNW2) 321 and 322 may be performed at a dose of about $1 \times 10^{13}$ atoms/cm$^2$ and with a certain level of energy so that a projection range ($R_P$) to the substrate is between about 1.2 micrometers to about 1.7 micrometers. In such a case, when measured from the top of the substrate, the first and second N-type deep well regions (DNW1 and DNW2) 321 and 322 may typically have a junction depth of at least about 1.5 micrometers to about 2 micrometers when measured after a subsequent drive-in process that is, a subsequent diffusion process.

As illustrated in FIG. 6, a P-type well region 370 may then be formed in the first N-type deep well region (DNW1) 321. An N-type well region 380 may be formed in the P-type well region 370. A first gate structure and a second gate structure may be formed on a portion of the N-type well region 380 and a portion of the P-type well region 370, respectively.

The first gate structure may be formed to include a gate insulation layer 391P and a gate electrode 392P which are sequentially stacked. The second gate structure may be formed to include a gate insulation layer 391N and a gate electrode 392N which are sequentially stacked. Before or after the first and second gate structures are formed, first impurity ions may be implanted into an upper region of the N-type well region 380 to form a channel region (383 of FIG. 3) and adjust a threshold voltage of a PMOS transistor 300P. Second impurity ions may be implanted into an upper region of the P-type well region 370 to form a channel region (373 of FIG. 3) and adjust a threshold voltage of an NMOS transistor 300N.

The first gate structure including the gate insulation layer 391P and the gate electrode 392P may be formed to vertically overlap with the channel region 383 formed in the N-type well region 380. The second gate structure including the gate insulation layer 391N and the gate electrode 392N may be formed to vertically overlap with the channel region 373 formed in the P-type well region 370.

Subsequently, N-type impurity ions may be implanted into the P-type well region 370 using the second gate structure 391N+392N as an ion implantation mask to form an N-type source region 371 and an N-type drain region 372. In addition, P-type impurity ions may be implanted into the N-type well region 380 using the first gate structure 391P+392P as an ion implantation mask to form a P-type source region 381 and a P-type drain region 382. As a result, the PMOS transistor 300P and the NMOS transistor 300N may be formed in the first region 310-1 of the substrate 310 to constitute a CMOS semiconductor device.

As illustrated in FIG. 7, an inductor 300C may be formed on the second N-type deep well region (DNW2) 322 which is formed in the second region 310-2 of the substrate 310. Specifically, an insulation layer 330 may be formed to cover the second N-type deep well region (DNW2) 322 which is formed in the second region 310-2 of the substrate 310. In some embodiments, the insulation layer 330 may be formed of a silicon oxide layer.

A lower metal layer 340 may be formed in the insulation layer 330. In order to form the lower metal layer 340, the insulation layer 330 may be formed by a plurality of process steps. For example, a lower insulation layer of the insulation layer 330 may be formed on the second N-type deep well region (DNW2) 322, and the lower metal layer 340 may be formed on a portion of the lower insulation layer to vertically overlap with a portion of the second N-type deep well region (DNW2) 322. An upper insulation layer of the insulation layer 330 may be formed on the lower metal layer 340 and the lower insulation layer of the insulation layer 330.

A first via 361 and a second via 362 may be formed in the upper insulation layer of the insulation layer 330. The first via 361 and the second via 362 may be formed to penetrate the upper insulation layer of the insulation layer 330. The first via 361 and a second via 362 may be connected to first and second ends of the lower metal layer 340, respectively.

A first upper metal layer 351 and a second upper metal layer 352 may be formed on the upper insulation layer of the insulation layer 330. The first upper metal layer 351 may be formed to be connected to the first via 361, and the second upper metal layer 352 may be formed to be connected to the second via 362. The lower metal layer 340, the first and second vias 361 and 362, and the first and second upper metal layers 351 and 352 may constitute the inductor 300C. The first upper metal layer 351 may be formed to have a spiral shape when viewed from the top, as described with reference to FIG. 2.

Figure 8:
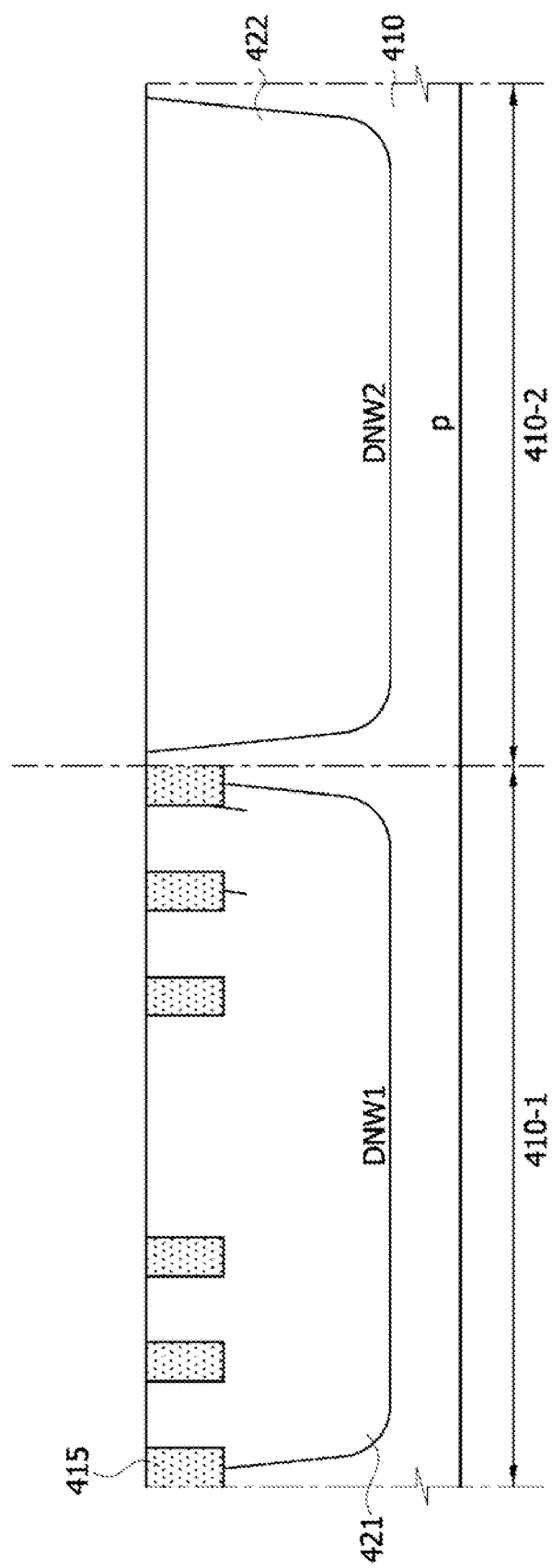
FIGS. 8, 9, 10, 11 and 12 are cross-sectional views illustrating a method of fabricating the RFIC shown in FIG. 4.

FIGS. 8, 9, 10, 11 and 12 are cross-sectional views illustrating a method of fabricating the RFIC 400 shown in FIG. 4. First, as illustrated in FIG. 8, a trench isolation layer 415 may be formed in a substrate 410 having a first region 410-1 and a second region 410-2. The substrate 410 may be a P-type substrate. The trench isolation layer 415 may be formed to define active regions. Subsequently, a first N-type deep well region (DNW1) 421 and a second N-type deep well region (DNW2) 422 may be formed in the first and second regions 410-1 and 410-2 of the substrate 410, respectively. The first and second N-type deep well regions (DNW1 and DNW2) 421 and 422 may be formed using an ion implantation process and a diffusion process. Although not shown in the drawings, an ion implantation mask may be formed on the substrate 410, and the ion implantation process for forming the first and second N-type deep well regions (DNW1 and DNW2) 421 and 422 may be performed using the ion implantation mask.

The first and second N-type deep well regions (DNW1 and DNW2) 421 and 422 may be simultaneously formed to have substantially the same junction depth and the same impurity concentration. In some embodiments, the ion implantation process for forming the first and second N-type deep well regions (DNW1 and DNW2) 421 and 422 may be performed at a dose of about $1 \times 10^{13}$ atoms/cm$^2$ and with a certain level of energy sufficient to make a projection range ($R_P$) to the substrate be between about 1.2 micrometers to about 1.7 micrometers is set in the substrate 410.

In such a case, the first and second N-type deep well regions (DNW1 and DNW2) 421 and 422 may typically have a junction depth of at least about 1.5 micrometers to about 2 micrometers when measured after a subsequent drive-in process that is, a subsequent diffusion process.

Figure 9:
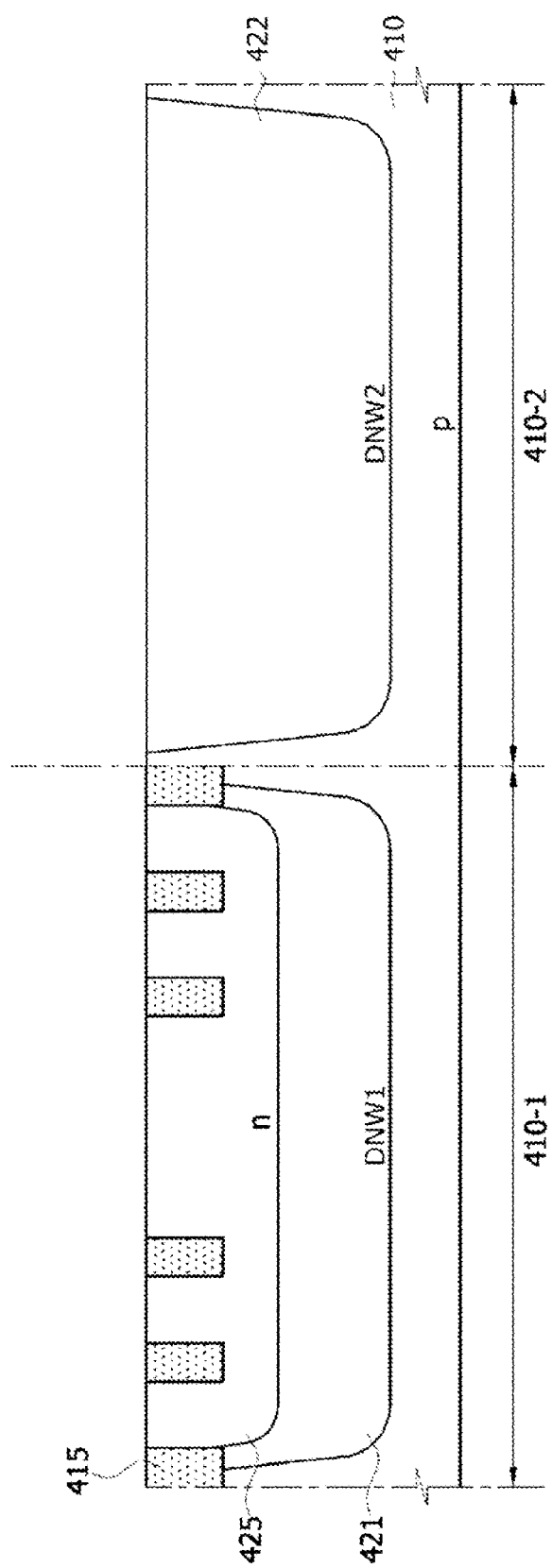

As illustrated in FIG. 9, an N-type well region 425 may then be formed in the first N-type deep well region (DNW1) 421. Sidewalls and a bottom surface of the N-type well region 425 may be surrounded by the first N-type deep well region (DNW1) 421. In some embodiments, upper sidewalls of the N-type well region 425 may be formed to contact a portion of the trench isolation layer 415. The N-type well region 425 may be formed to be shallower than the first N-type deep well region (DNW1) 421. That is, the projection range (Rp) of an ion implantation process for forming the N-type well region 425 may be less than the projection range (Rp) of the ion implantation process for forming the first N-type deep well region (DNW1) 421.

Figure 10:
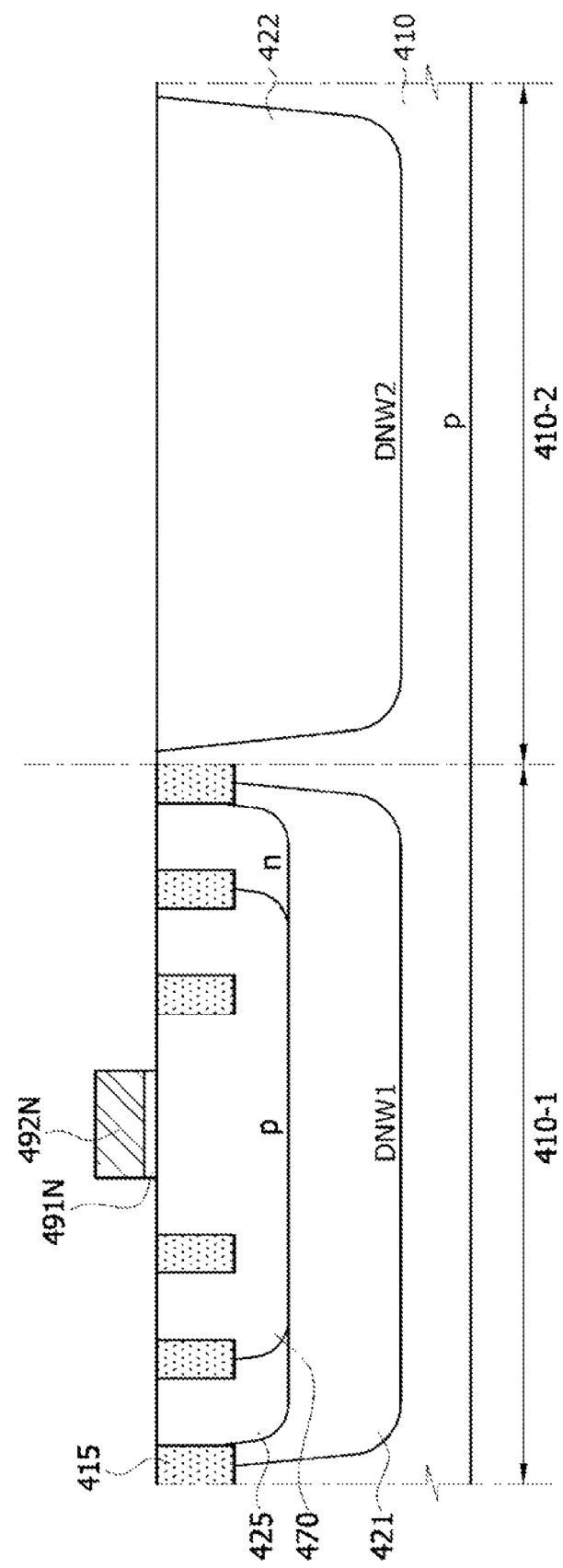

As illustrated in FIG. 10, a P-type well region 470 may be formed in the N-type well region 425. Sidewalls of the P-type well region 470 may be surrounded by the N-type well region 425, and a bottom surface of the P-type well region 470 may contact the first N-type deep well region (DNW1) 421.

Subsequently, a gate structure may be formed on a portion of the P-type well region 470. The gate structure may be formed to include a gate insulation layer 491N and a gate electrode 492N which are sequentially stacked.

Figure 11:
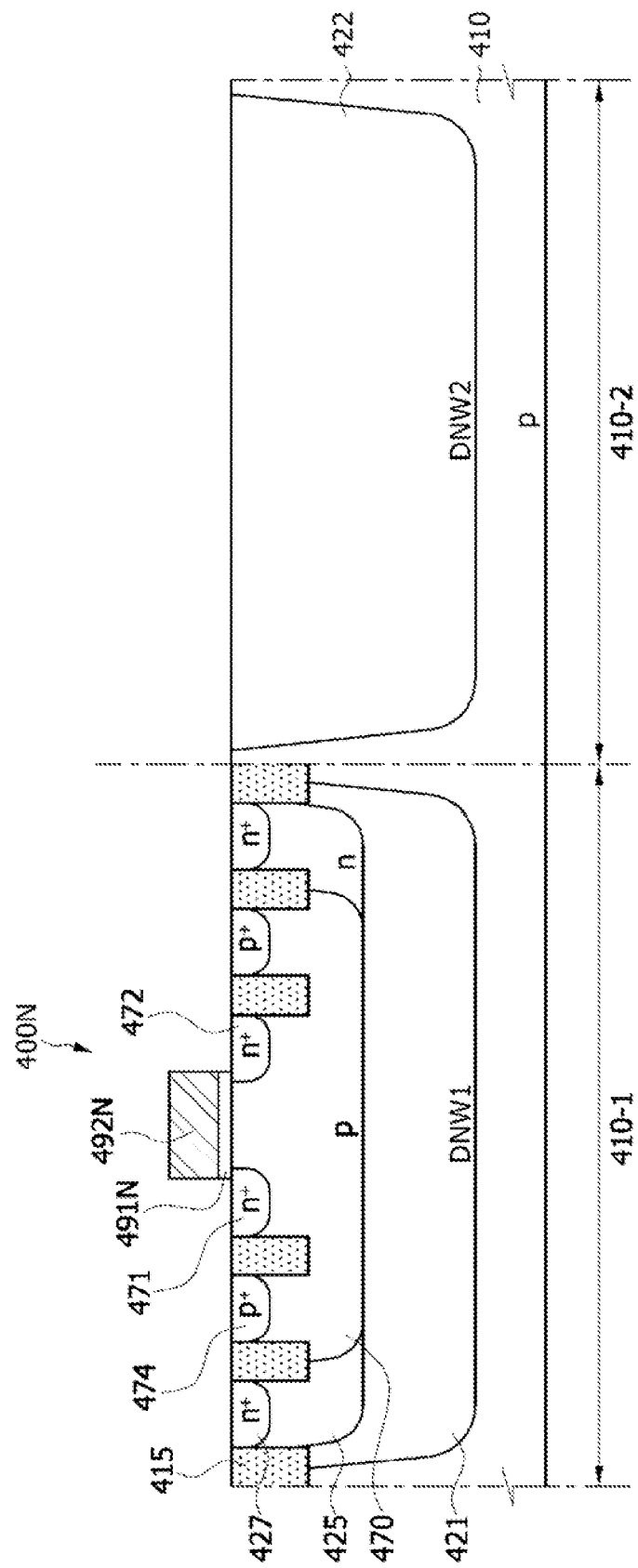

As illustrated in FIG. 11, N-type impurity ions may be implanted into some active regions in the first region 410-1 using the gate electrode 492N and the trench isolation layer 415 as ion implantation masks, thereby forming an N-type source region 471, an N-type drain region 472, and an N-type well contact region 427.

The N-type source/drain regions 471 and 472 may be formed in an upper region of the P-type well region 470, and the N-type well contact region 427 may be formed in an upper region of the N-type well region 425.

In addition, P-type impurity ions may be implanted into the other active regions using the gate electrode and the trench isolation layer 415 as ion implantation masks, thereby forming a P-type well contact region 474. The P-type well contact region 474 may be formed in an upper region of the P-type well region 470 and be spaced apart from the N-type source/drain regions 471 and 472. That is, the P-type well contact region 474 may be separated from the N-type source/drain regions 471 and 472 by the trench isolation layer 415. As a result, an NMOS transistor 400N may be formed in the first region 410-1 of the substrate 410.

The NMOS transistor 400N may be formed to include five terminals (not shown) which are electrically connected to the N-type well contact region 427, the P-type well contact region 474, the N-type source region 471, the N-type drain region 472, and the gate electrode 492N, respectively.

Figure 12:
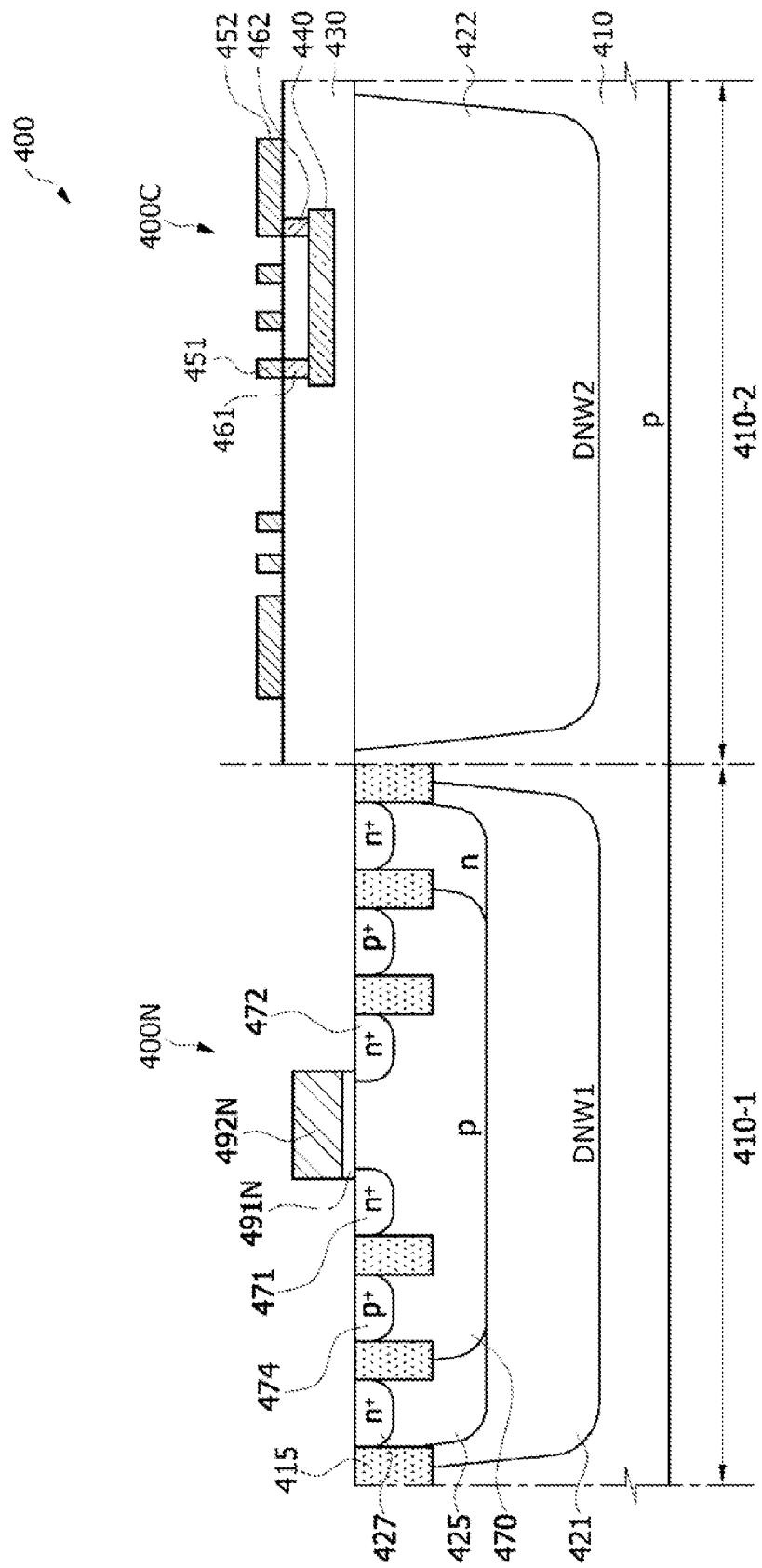

As illustrated in FIG. 12, an inductor 400C may be formed on the second N-type deep well region (DNW2) 422 which is formed in the second region 410-2 of the substrate 410. Specifically, an insulation layer 430 may be formed to cover the second N-type deep well region (DNW2) 422 which is formed in the second region 410-2 of the substrate 410. In some embodiments, the insulation layer 430 may be formed of a silicon oxide layer. A lower metal layer 440 may be formed in the insulation layer 430.

In order to form the lower metal layer 440, the insulation layer 430 may be formed by a plurality of process steps. For example, a lower insulation layer of the insulation layer 430 may be formed on the second N-type deep well region (DNW2) 422, and the lower metal layer 440 may be formed on the lower insulation layer of the insulation layer 430 to vertically overlap with the second N-type deep well region (DNW2) 422.

An upper insulation layer of the insulation layer 430 may be formed on the lower metal layer 440 and the lower insulation layer of the insulation layer 430.

A first via 461 and a second via 462 may be formed in the upper insulation layer of the insulation layer 430. The first via 461 and the second via 462 may be formed to penetrate the upper insulation layer of the insulation layer 430. The first via 461 and a second via 462 may be formed to be connected to first and second ends of the lower metal layer 440, respectively.

A first upper metal layer 451 and a second upper metal layer 452 may be formed on the upper insulation layer of the insulation layer 430. The first upper metal layer 451 may be formed to be connected to the first via 461, and the second upper metal layer 452 may be formed to be connected to the second via 462. The lower metal layer 440, the first and second vias 461 and 462, and the first and second upper metal layers 451 and 452 may, in combination, constitute the inductor 400C. The first upper metal layer 451 may be formed to have a spiral shape when viewed from the top, as described with reference to FIG. 2.

According to the embodiments, an inductor may be formed over an N-type deep well region having a high resistive characteristic. Thus, the Q factor of the inductor may increase. The embodiments of the present disclosure are for illustrative purposes.

What is claimed is:

1. A radio-frequency integrated circuit (RFIC) comprising:
   a substrate:
   an N-type deep well region disposed in an upper region of the substrate and having a top surface coplanar with a top surface of the substrate, wherein the N-type deep well region is a single well structure in which no impurity diffusion region is disposed;
   an inductor disposed over the N-type deep well region; and
   an insulation layer disposed between the inductor and the N-type deep well region,
   wherein the inductor is electrically insulated from the N-type deep well region by the insulation layer,
   wherein the N-type deep well region directly contacts the insulation layer, and
   wherein there is no active element between the insulation layer and the N-type deep well region.

2. The RFIC of claim 1, wherein the inductor includes:
   a lower metal layer disposed in the insulation layer;
   a first upper metal layer electrically connected to a first end of the lower metal layer through a first via; and
   a second upper metal layer electrically connected to a second end of the lower metal layer through a second via.

3. The RFIC of claim 1, wherein the insulation layer directly contacts the first and second upper metal layers.

4. The RFIC of claim 1, wherein the N-type deep well region has a junction depth of about 1.5 micrometers to about 2 micrometers when measured from the top of the N-type deep well region.

5. The RFIC of claim 1, wherein the entire inductor overlaps with a portion of the N-type deep well region.

6. A radio-frequency integrated circuit (RFIC) comprising:
   a substrate having a first region and a second region;
   a first N-type deep well region and a second N-type deep well region respectively disposed in the first region and the second region of the substrate, wherein the second N-type deep well region is a single well structure in which no impurity diffusion region is disposed;
   an active element disposed in the first N-type deep well region; and
   an inductor disposed over the second N-type deep well region,
   wherein the inductor is electrically insulated from the second N-type deep well region by an insulation layer disposed between the inductor and the second N-type deep well region,
   wherein the second N-type deep well region directly contacts the insulation layer, and
   wherein there is no active element between the insulation layer and the second N-type deep well region.

7. The RFIC of claim 6, wherein a top surface of the second N-type deep well region is coplanar with a top surface of the second region of the substrate.

8. The RFIC of claim 7, wherein the inductor includes:
   a lower metal layer disposed in the insulation layer;
   a first upper metal layer electrically connected to a first end of the lower metal layer through a first via; and
   a second upper metal layer electrically connected to a second end of the lower metal layer through a second via.

9. The RFIC of claim 6, wherein the insulation layer directly contacts the first and second upper metal layers.

10. The RFIC of claim 6, wherein the entire inductor overlaps with a portion of the second N-type deep well region.

11. The RFIC of claim 6, wherein the first and second N-type deep well regions have substantially the same junction depth.

12. The RFIC of claim 11, wherein the junction depth is formed in the substrate and to the depth about 1.5 micrometers to about 2.0 micrometers when measured from a top surface of the substrate.

13. The RFIC of claim 11, wherein the active element includes:
   a P-type well region disposed in the first N-type deep well region;
   an N-type well region disposed in the P-type well region; and
   a PMOS transistor disposed in the N-type well region.

14. The RFIC of claim 11, wherein the active element includes:
   a P-type well region disposed in the first N-type deep well region; and
   an NMOS transistor disposed in the P-type well region.

15. The RFIC of claim 11, wherein the active element includes:
   a P-type well region disposed in the first N-type deep well region;
   an N-type well region disposed in the P-type well region;
   a PMOS transistor disposed in the N-type well region; and
   an NMOS transistor disposed in the P-type well region,
   wherein the PMOS transistor and the NMOS transistor are disposed laterally and spaced apart from each other.

16. The RFIC of claim 11, wherein the semiconductor device includes:
   a P-type well region disposed in the first N-type deep well region;
   an N-type well region disposed in the first N-type deep well region and surrounding a sidewall of the P-type well region; and
   an NMOS transistor disposed in the P-type well region.

* * * * *